United States Patent [19]
Prudham

[11] Patent Number: 5,880,551
[45] Date of Patent: Mar. 9, 1999

[54] POLYPHASE MOTOR, PARTICULARLY FOR DRIVING AN INDICATOR NEEDLE

[75] Inventor: Daniel Prudham, Thise, France

[73] Assignee: Sonceboz Sa, Sonceboz, Switzerland

[21] Appl. No.: 955,357

[22] Filed: Oct. 21, 1997

[30] Foreign Application Priority Data

Oct. 21, 1996 [FR] France .................................. 96 12765

[51] Int. Cl.⁶ .................................................. H02K 21/12
[52] U.S. Cl. ........................................ 310/254; 310/156
[58] Field of Search .................... 310/153, 162, 310/216, 254, 156

[56] References Cited

U.S. PATENT DOCUMENTS

| | | | |
|---|---|---|---|
| 4,220,882 | 9/1980 | Kahzai et al. | 310/186 |
| 4,275,322 | 6/1981 | Cavil et al. | 310/111 |
| 4,475,051 | 10/1984 | Chai et al. | 310/49 |
| 4,769,567 | 9/1988 | Kurauchi et al. | 310/156 |
| 5,682,072 | 10/1997 | Takahashi | 310/156 |
| 5,708,406 | 1/1998 | Tsunoda et al. | 335/272 |

*Primary Examiner*—Nestor Ramirez
*Assistant Examiner*—Joseph Waks
*Attorney, Agent, or Firm*—Oblon, Spivak, McClelland, Maier & Neustadt, P.C.

[57] ABSTRACT

A polyphase motor formed by a stationary member excited by electric coils and by a magnetized rotor. The rotor has N pairs of poles magnetized radially in alternating directions, N being equal to 4 or 5. The stationary member has at least two W-shaped circuits each including an electric coil surrounding the central strut. The W-shaped circuits are arranged so that when one of the central struts is opposite a magnetic transition, the other central strut is roughly opposite a magnetic pole. Pole shoes of the central struts of the two W-shaped circuits can also be spaced at 120° angles.

19 Claims, 4 Drawing Sheets

POLYPHASE MOTOR, PARTICULARLY FOR DRIVING AN INDICATOR NEEDLE

BACKGROUND OF THE INVENTION

1. Field of the Invention

The present invention is directed to an electric polyphase motor, particularly for driving an indicator needle.

2. Discussion of the Background

Polyphase motors are, for example, described in European patent EP 587685.

State of the art step motors have a jerky movement, due to the fact that one magnetized pole of a rotor finds a privileged balanced state when it is placed opposite a stationary tooth, or when a transition between two magnetic poles is opposite a stationary tooth. As a result, a detent torque constitutes a periodic function of an angular position whose rate depends on a number of magnetic poles and on a number of stationary poles. In the current state of the art, it has been attempted to "smooth out" this function by increasing the number of poles. Nevertheless this involves greater mechanical complexity and higher manufacturing and assembly costs.

SUMMARY OF THE INVENTION

Accordingly, one object of the present invention is to improve on background polyphase motors so as to increase torque and eliminate a flux closure part without losing an advantage of manufacturing simplicity and options for integrating related mechanisms such as regulating switches.

To this end, the present invention is directed to a novel polyphase motor formed by a stationary member excited by electric coils and by a magnetized rotor with N pairs of poles magnetized radially in alternating directions, N being equal to 4 or 5. The stationary member has at least two W-shaped circuits each including an electric coil surrounding a central strut. The W-shaped circuits are arranged so that when one of the central struts is opposite a magnetic transition, the other central strut is approximately opposite a magnetic pole. Polar shoes of the central struts of the two W-shaped circuits belonging to different phases are distanced from each other angularly by an angle roughly equal to 120°.

Such a motor meets the objects of the present invention due to an increased number of fractional teeth (6 or 9 instead of 4) and due to a reduction of a distance of travel of flux lines through the air. The "W" shape of the stator circuit ensures closure of the flux lines between a central pole that receives an electric coil and two adjacent poles.

In a preferred embodiment, the present invention may involve a low-cost, narrow assembly motor. The stator has 2 W-shaped circuits whose central struts may be separated by 120°. The stator also bear coils, one of which is fed by a sin ρ signal, the other by a sin ρ+120° signal.

According to one variation, the exterior struts of the two W-shaped circuits are connected by a notched segment in the shape of a circle arc, the notched segment advantageously having stationary teeth 40° apart. This variation allows the production of a motor with a reduced number of components, i.e., a rotor and a stator formed of a single piece bearing only two electric coils.

A further object of the present invention is to eliminate the disadvantage of background jerky movement by proposing a novel construction offering an appreciable restriction of the detent torque with a reasonable number of magnetic and stationary poles.

To this end, the present invention may further include in a preferred mode of embodiment a novel polyphase motor formed by three W-shaped circuits thereby forming a stator with 9 poles. Central struts of the W-shaped circuits are positioned radially and form 120° angles between each other. They bear coils fed by three signals: sin ρ, sin ρ+120°, sin ρ−120°.

This structure makes it possible to reduce the detent torque considerably by canceling $2^{nd}$ and $4^{th}$ harmonics of the function (detent torque, angular position). Therefore, the motor in accordance with the present invention has a smooth movement despite the reduced number of magnetic or stationary poles.

Advantageously, the struts receiving the electric coils extend into a hollowed central portion whose dimensions allow the insertion of an electric coil in a plane of the struts and positioning around the corresponding strut via translation. The electric coils can therefore be manufactured separately according to more economical processes than a winding around a complex stationary member, and then be wound around the corresponding struts. The stator can be manufactured according to simple, low-cost procedures. The fact that it is formed of a single cut-out piece eliminates assembly precision and loss of adjustment problems.

Preferably, the struts bearing the electric coils may extend radially. According to a specific mode of the present invention, the stator is made up of a stack of metal sheets. This mode allows the use of low cost machining techniques for cutting out the stator, and improves the magnetic performance of the stator.

Preferably, a front end of the pole shoe may also be located in a plane of an inside front face of the coil.

According to a specific variation, the rotor may be formed by a magnet which is magnetized according to a direction perpendicular to a plane of the stator and placed between two notched disks with staggered teeth. According to a another specific variation, the polyphase motor may have an auxiliary flux closure part, advantageously a part for closure of the magnetic flux which is made of a soft material coaxial with the rotor.

According to one feature of the present invention, the magnetic flux closure part may be a cylindrical part in the shape of a ring. This ring may be stationary with respect to the rotor, or it may be an integral part of the magnet. According to a further feature of the present invention, the magnetic flux closure part may be a cylindrical part in the shape of a ring with grooves forming teeth that are placed at right angles to the stationary teeth.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
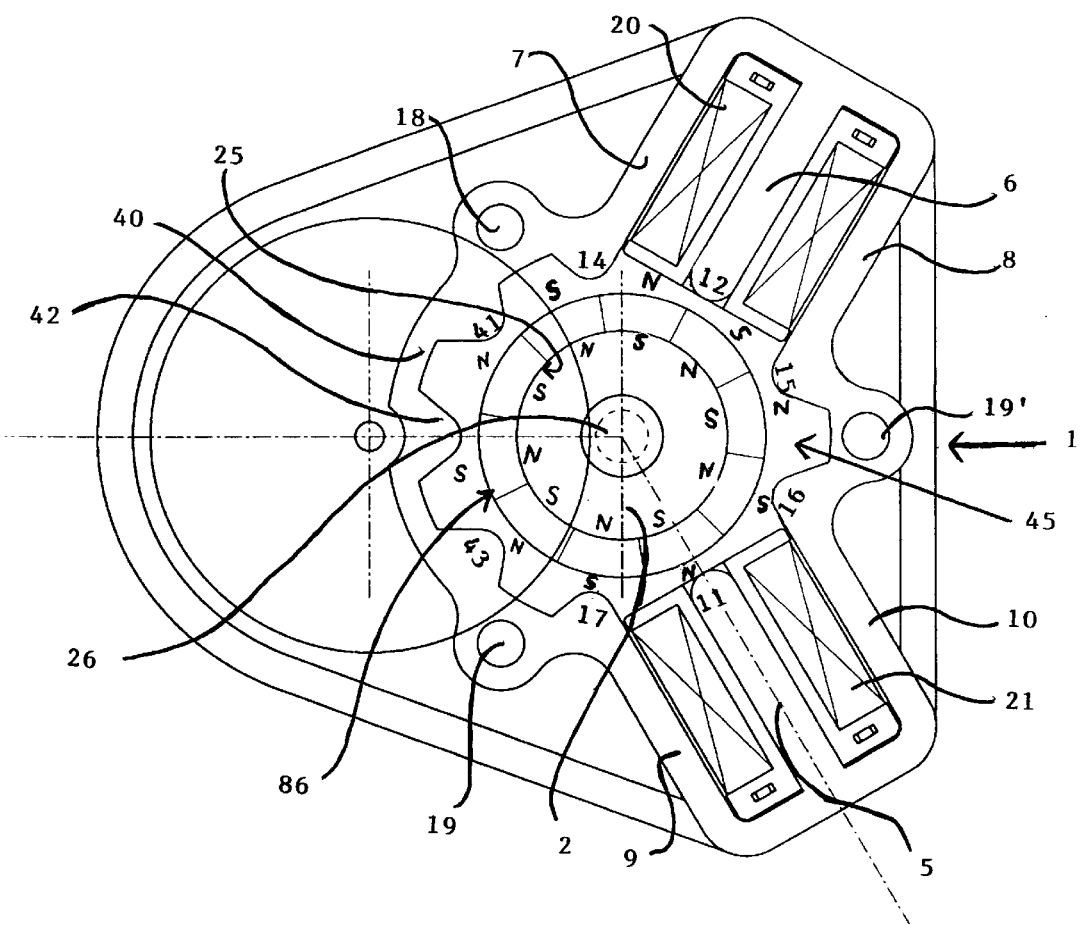
FIGS. 1 and 2 respectively show a top view and lateral cross-section of a first variation of a two-coil motor in accordance with the present invention.
Figure 2:
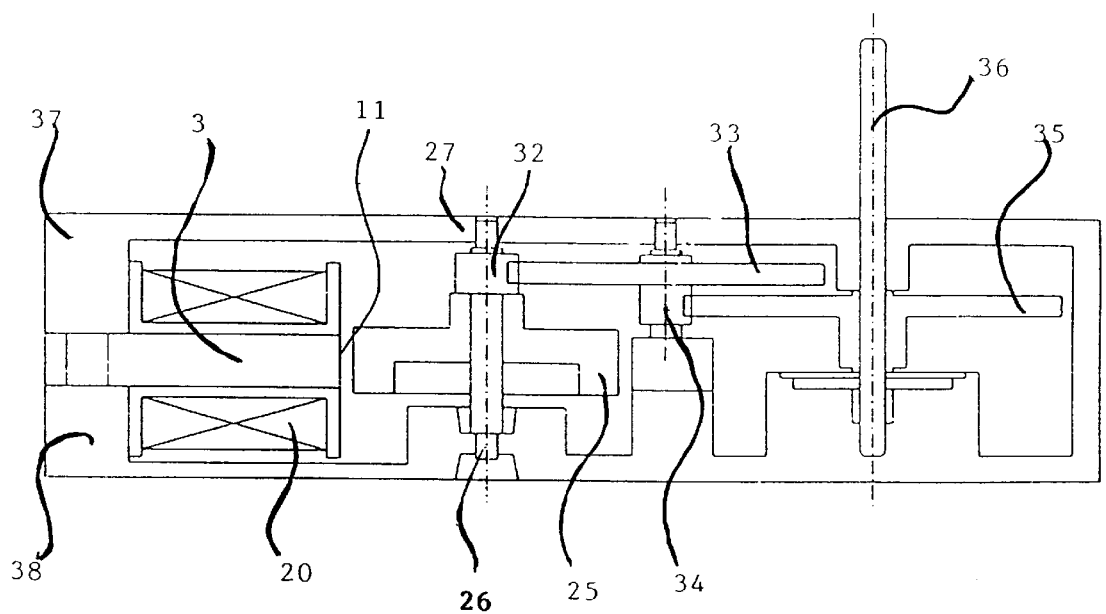

Referring now to the drawings, wherein like reference numerals designate identical or corresponding parts throughout the several views, and more particularly to FIGS. 1 and 2 thereof, these FIGS. 1 and 2 respectively show a top view and lateral cross-section of a motor in accordance with the present invention. The motor includes a stator 1 and a rotor 2.

The stator 1 is produced by cutting the stator 1 out of a metal sheet 2 millimeters thick, or by stacking several metal sheets of a magnetically soft material. The stator has two W-shaped circuits 3, 4 each respectively having a central strut 5, 6 and two side struts 7, 8 and 9, 10. The central struts 5, 6 each end respectively with a pole shoe 11, 12. The side struts also have pole shoes 14–17. The stator 1 additionally has holes 18, 19, 19' for use as elements for anchoring to a support, screws, or rivets, for example.

The stator is thus formed of three polar teeth triplets. The two W-shaped circuits 3, 4 are connected by a notched segment 40 with polar teeth 41–43. The unit formed by the W-shaped circuits 3, 4 and by the notched sector can be cut out in a single piece of a magnetically soft material or can be formed of several sheets that form a stack.

The central struts 5, 6 respectively receive electric coils 20, 21. These two central struts 5, 6 can be oriented radially. The electric coils 20, 21 are fed by dephased electrical signals, for example a Usin (ρt) signal and a Usin (ρt+120°) signal.

The rotor 2 is formed by a cylindrical part 25 magnetized radially to present SOUTH poles and NORTH poles in an alternating fashion to the exterior surface 86. The magnetized part can be formed by combining 10 thin tile-shaped magnets affixed to a cylindrical core or by magnetization of tubular segments. Another option includes surface magnetizing scalloped sections cylindrically so that two opposite poles are formed by adjacent peripheral surface elements connected by a zone in the shape of a circular arc that enters inside the cylindrical element.

The rotor 2 is supported in a known manner by pivots 26, 27 as shown in FIG. 2.

The central struts 5, 6 of the two opposite phases bearing the electric coils 20, 21 are oriented so that when a magnetic pole 30 is opposite one of the pole shoes 12, the other pole shoe 11 is roughly opposite a transition 31.

The rotor 2 may also have a notched ring 32 suitable for driving a gear train 33 to 35. This gear train transmits rotational movement to an output shaft 36.

In the example described, the stator 1 is housed in a housing formed by two complementary shells 37, 38 that additionally help maintain the axes of the gear train 32 to 35.

The central portion 45 of the stator 1 may be hollow. The insertion of electric coils 20, 21 may then be accomplished by an initial displacement perpendicular to the plane of the stator corresponding to the plane of FIG. 1, then by displacement via radial translation to cause the respective electric coils 20, 21 to slide around one of the central struts 5, 6. Of course this operation is carried out prior to positioning the rotor 2. The electric coils 20, 21 can be formed onto a core whose section is complementary to that of the central struts 5, 6 and which has a front face that is flush with the end of the pole shoe 11, 12 of the corresponding central strut 5, 6.

Figure 3:
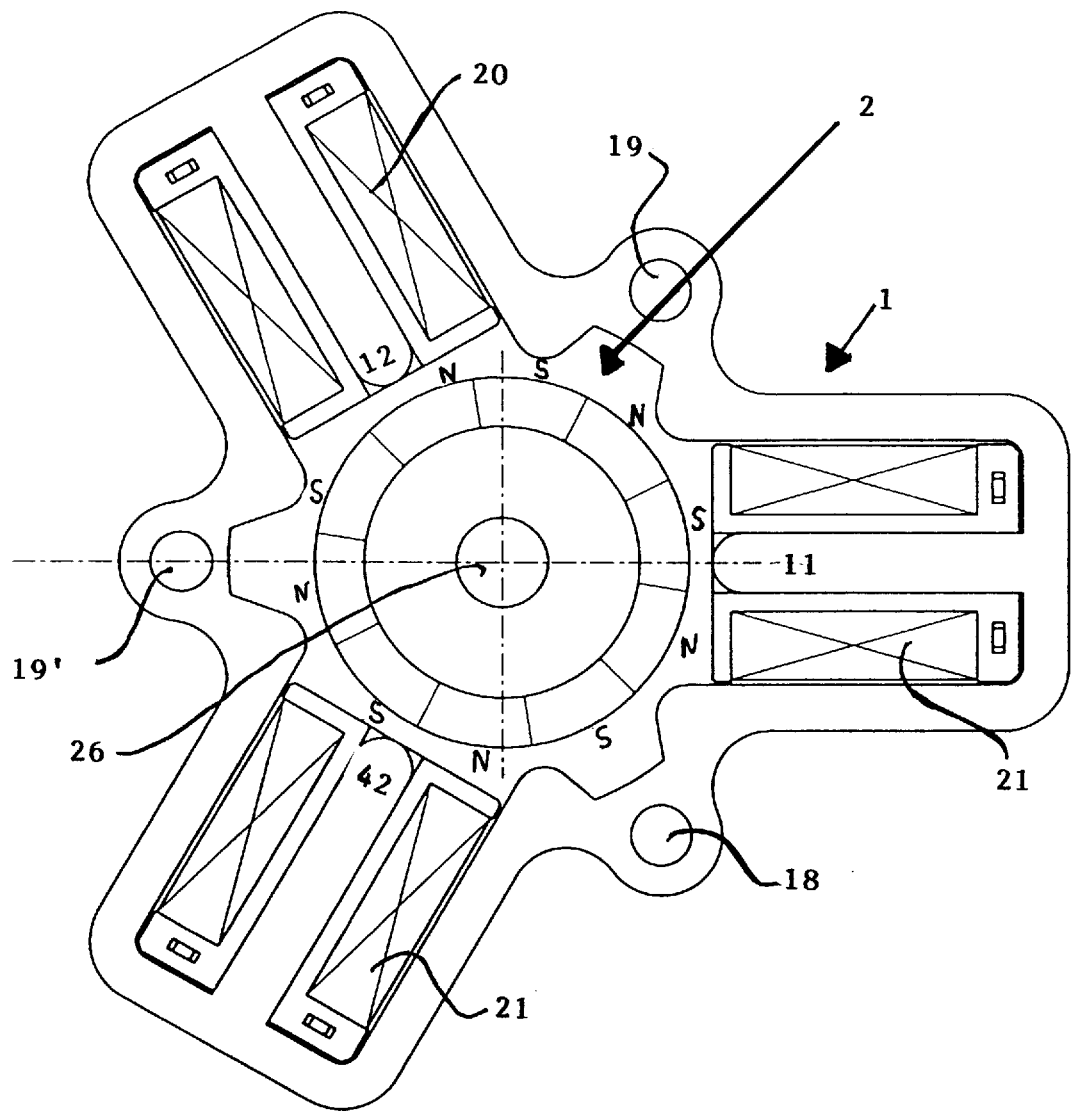
FIG. 3 shows a top view of a variation of the three-coil motor in accordance with the present invention.

FIG. 3 shows a top view of a further embodiment variation of the present invention of a novel motor including three W-shaped circuits separated by 120°. Each W-shaped circuit includes an electric coil 20, 21, 21' fed by 120° dephased signals.

Figure 4:
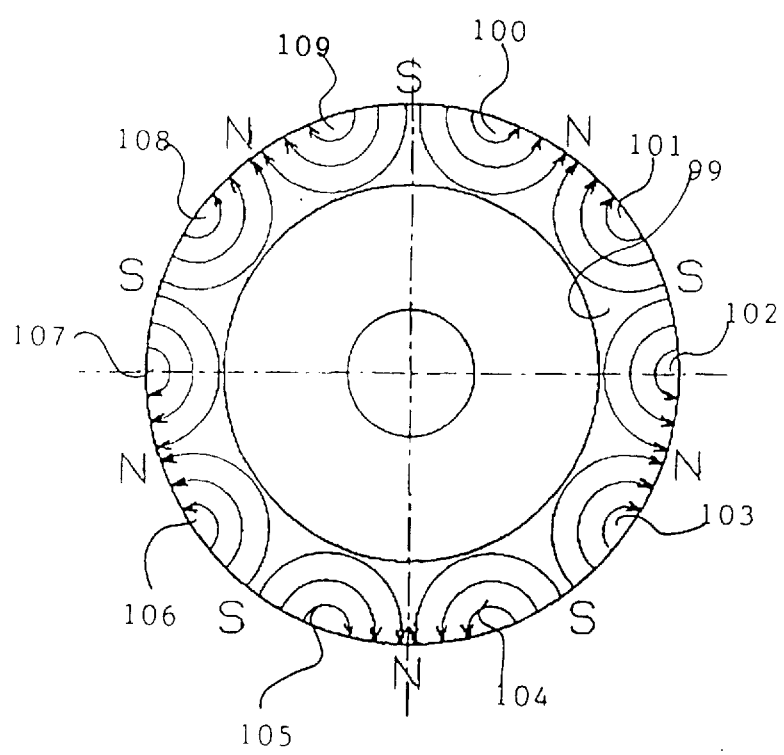
FIG. 4 shows a lateral cross-section of a rotor for the motor in accordance with the present invention.

FIG. 4 is a lateral cross-section of another rotor variation of the present invention. In this variation the rotor includes a ring 99 of a magnetically soft material with ten zones 100 to 109 magnetized in a scalloped fashion in order to present alternating poles to the surface of the ring 99.

Obviously, numerous additional modifications and variations of the present invention are possible in light of the above teachings. It is therefore to be understood that within the scope of the appended claims, the present invention may be practiced otherwise than as specifically described herein.

What is claimed as new and desired to be secured by Letters Patent of the United States is:

1. A polyphase motor comprising:
    a stationary member excited by electric coils and by a magnetized rotor, the magnetized rotor having N pairs of poles magnetized radially in alternating directions separated by magnetic transitions, N being equal to 4 or 5; and
    wherein the stationary member includes at least first and second W-shaped circuits, said at least first and second W-shaped circuits including respective first and second central struts with respective first and second pole shoes, each of said at least first and second W-shaped circuits being arranged so that when the first central strut is opposite a magnetic transition of the magnetized rotor, the second central strut is roughly opposite a magnetic pole, and the first and second pole shoes of the first and second central struts of the at least first and second W-shaped circuits being angularly displaced by an angle roughly equal to 120°.

2. A polyphase motor in accordance with claim 1, wherein the at least first and second W-shaped circuits are separated by 120° and each of the at least first and second W-shaped circuit further includes an electric coil fed by 120° dephased signals.

3. A polyphase motor in accordance with claim 1, wherein the stationary member further includes a third W-shaped circuit separated by 120° from the at least first and second W-shaped circuits, each of said first, second and third W-shaped circuits further including an electric coil fed by 120° dephased signals.

4. A polyphase motor in accordance with claim 2, wherein each of the at least first and second W-shaped circuits further includes exterior struts connected by a notched segment shaped of a circular arc.

5. A polyphase motor in accordance with claim 4, wherein the notched segment has stationary teeth.

6. A polyphase motor in accordance with claim 1, wherein the stationary member has a hollow central portion with dimensions which allow insertion of an electric coil in a plane of the first and second central struts and positioning around a corresponding of the first and second central strut via translation.

7. A polyphase motor in accordance with claim 1, wherein the first and second central struts bear electric coils and extend radially.

8. A polyphase motor in accordance with claim 1, wherein the stationary member is made up of a stack of metal sheets.

9. A polyphase motor in accordance with claim 1, wherein a front end of the first and second pole shoes is located in a plane of a front internal face of an electric coil of each of the at least first and second W-shaped circuits.

10. A polyphase motor in accordance with claim 1, wherein the rotor is formed by a magnet magnetized according to a direction perpendicular to a plane of the stationary member, and the rotor is placed between two notched disks with staggered teeth.

11. A polyphase motor as stated in claim 1, wherein the rotor is formed by a ring magnetized in a scalloped fashion.

12. A polyphase motor as stated in claim 1, further comprising an auxiliary flux closure part.

13. A polyphase motor in accordance with claim 11, further comprising a magnetic flux closure part which is a cylindrical part in a shape of a ring with grooves forming teeth placed opposite teeth.

14. A polyphase motor comprising:

a stationary member excited by electric coils and by a magnetized rotor, the magnetized rotor having N pairs of poles magnetized radially in alternating directions separated by magnetic transitions, N being equal to 4 or 5; and wherein the stationary member includes at least first and second W-shaped circuits, said at least first and second W-shaped circuits including respective first and second central struts with respective first and second pole shoes, each of said at least first and second W-shaped circuits being arranged so that when the first central strut is opposite a magnetic transition of the magnetized rotor, the second central strut is roughly opposite a magnetic pole.

15. A polyphase motor in accordance with claim 14, wherein the at least first and second W-shaped circuits are separated by 120° and each of the at least first and second W-shaped circuit further includes an electric coil fed by 120° dephased signals.

16. A polyphase motor in accordance with claim 14, wherein the stationary member further includes a third W-shaped circuit separated by 120° from the at least first and second W-shaped circuits, each of said first, second and third W-shaped circuits further including an electric coil fed by 120° dephased signals.

17. A polyphase motor comprising:

a stationary means excited by electric coil means and by a magnetized rotor means, the magnetized rotor means having N pairs of poles magnetized radially in alternating directions separated by magnetic transitions, N being equal to 4 or 5; and wherein the stationary means includes at least first and second W-shaped circuit means, said at least first and second W-shaped circuit means including respective first and second central strut means with respective first and second pole shoe means, each of said at least first and second W-shaped circuit means being arranged so that when the first central strut means is opposite a magnetic transition of the magnetized rotor means, the second central strut means is roughly opposite a magnetic pole, and the first and second pole shoe means of the first and second central strut means of the at least first and second W-shaped circuit means being angularly displaced by an angle roughly equal to 120°.

18. A polyphase motor in accordance with claim 17, wherein the at least first and second W-shaped circuit means are separated by 120° and each of the at least first and second W-shaped circuit means further includes an electric coil means fed by 120° dephased signals.

19. A polyphase motor in accordance with claim 17, wherein the stationary means further includes a third W-shaped circuit means separated by 120° from the at least first and second W-shaped circuit means, each of said first, second and third W-shaped circuit means further including an electric coil means fed by 120° dephased signals.

\* \* \* \* \*